United States Patent
Kimmel et al.

(10) Patent No.: US 6,420,772 B1
(45) Date of Patent: Jul. 16, 2002

(54) RE-SETTABLE TRISTATE PROGRAMMABLE DEVICE

(75) Inventors: Kurt R. Kimmel, Jericho, VT (US); J. Alex Chediak, Wappingers Falls, NY (US); William T. Motsiff, Essex Junction, VT (US); Wilbur D. Pricer, Charlotte, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/417,438

(22) Filed: Oct. 13, 1999

(51) Int. Cl.[7] .............................................. H01L 29/00
(52) U.S. Cl. .................................................. 257/529
(58) Field of Search ........................... 257/529; 438/132

(56) References Cited

U.S. PATENT DOCUMENTS

| | | | |
|---|---|---|---|
| 4,021,705 A | * 5/1977 | Lichtblau | .................... 361/402 |
| 4,598,338 A | * 7/1986 | Van Devender et al. | .... 361/435 |
| 5,075,247 A | 12/1991 | Mathews | |
| 5,264,725 A | 11/1993 | Mullarkey et al. | |
| 5,760,674 A | 6/1998 | Gilmour et al. | |
| 5,795,819 A | 8/1998 | Motsiff et al. | |
| 5,834,825 A | 11/1998 | Imai | |

* cited by examiner

Primary Examiner—Douglas A Wille
(74) Attorney, Agent, or Firm—McGinn & Gibb, PLLC; Howard J. Walter, Jr., Esq.

(57) ABSTRACT

A method and structure for a programmable circuit that includes a magnetic device having a reluctance which is alterable. The magnetic device can be programmed into one of three magnetic field orentations or states. Conventional VLSI fabrication steps are used for compatability with low-k dielectric Back-End-Of-Line (BEOL) processing.

8 Claims, 4 Drawing Sheets

RE-SETTABLE TRISTATE PROGRAMMABLE DEVICE

BACKGROUND OF THE INVENTION

1. Field of the Invention

The present invention generally relates to fuses and more particularly to a programmable magnetic fuse which has more than two states.

2. Description of the Related Art

Conventional systems utilize fuses in semiconductor chips to provide redundancy, electrical chip identification and customization of function. For designs having three (or more) layers of wiring, the fuses are typically formed from a segment of one of the wiring layers, e.g. the "last metal" or "last metal minus one" wiring layer. Fusing (i.e. deletion of a segment of metal fuse line) is accomplished by exposing the segment to a short, high intensity pulse of "light" from an infra-red laser. The metal line absorbs energy, superheats, melts and expands, and ruptures any overlaying passivation. The molten metal then boils, vaporizes or explodes out of its oxide surroundings, disrupting line continuity and causing high electrical resistance. A "sensing" circuit is used to detect fuse segment resistance. Sense circuits can be designed to "understand" that fusing has occurred when line resistance increases or line resistance decreases.

Because of line-to-line coupling which slows signal propagation, there is a trend for the Inter-Level Dielectric (ILD) to be comprised of polyimide nanofoams or porous glass (Zero Gel is an example). These dielectrics are of a class characterized by having low dielectric constants (K). They are not solid materials and will collapse under standard laser fuse blow conditions, leading to unreliability and possibly yield degradation.

Also, to improve signal propagation, high conductance materials such as copper are being used as conductors. More specifically, resistance is reduced by using copper interconnect wiring. However, if copper lines are blown and left exposed, they easily corrode resulting in reliability exposures.

However, conventional laser blowing (or even electrical blowing) may damage the ILD, causing it to collapse and change its dielectric constant. The laser fusing could also release particles of copper into the porous films, presenting potential reliability concerns and possibly comprising the basic local structural integrity of the chip.

Therefore, there is a need for a new type of fuse structure which can be blown (e.g., opened) without suffering the reliability problems associated with conventional fuses.

SUMMARY OF THE INVENTION

Therefore, it is an object of the present invention to provide a structure and method for a programmable circuit that includes a magnetic device having a reluctance which is alterable. The programmable circuit includes the magnetic material and a sensing circuit for detecting the reluctance. The reluctance includes a magnetic field aligned in a first direction. The programmable circuit further includes a plurality of magnetic devices having different reluctances. The first devices of the magnetic devices have a first magnetic field aligned in a first direction and second devices of the magnetic devices have a second magnetic field aligned in a second direction, different than the first direction. The third devices of the magnetic devices have no magnetic field. The magnetic devices are tristate fuses.

A method of programming magnetic devices includes aligning magnetic fields of the magnetic devices in a first direction, selectively aligning magnetic fields of first devices of the magnetic devices in a second direction and sensing a magnetic state of the magnetic devices. The aligning process further includes heating and cooling the magnetic devices in a first magnetic field and the selectively aligning includes heating and cooling the first devices in a second magnetic field. The second magnetic field could have a directional characteristic different than the first magnetic field and the second magnetic field could have a strength less than that of the first magnetic field. The heating could be selective application of laser energy.

The method may also selectively neutralize magnetic fields of the second devices. The neutralizing includes heating and cooling the second magnetic devices in a magnetic field equal to and opposite the Earth's magnetic field. The neutralizing may alternatively include removing the second devices.

This structure and process is superior to conventional fuses because low level energy magnetic and laser sources are utilized to program the device instead of conventional higher power laser sources. The energy level utilized by the invention does not cause the fuse material to explode or boil as conventional fusing processes do. Therefore, programming (or blowing) the inventive device does not damage the surrounding dielectric material. Further, since the magnetic material does not explode and possibly extend above the dielectric, it will not corrode or detract from the reliability of the remaining circuit.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
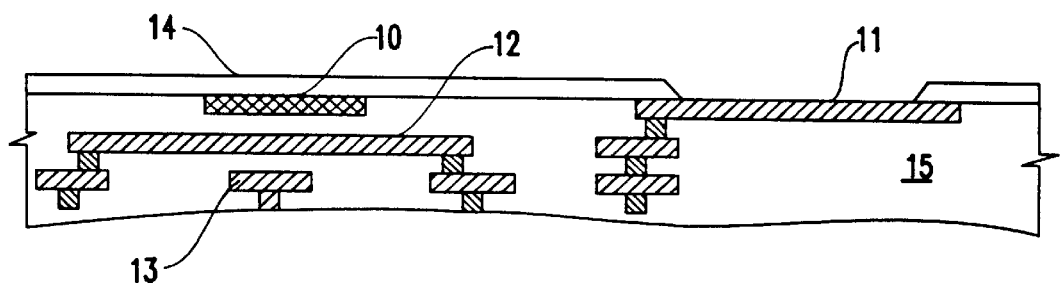
FIG. 1 is a schematic diagram of a cross-section of the inventive fuse.

Referring now to the drawings, and more particularly to FIG. 1, a new type of programming device (e.g., such as a fuse/antifuse), method of fabrication and method of programming is disclosed. The invention is particularly suited for semiconductor applications where low interlevel dielectric and copper interlevel wiring is used, though the invention is not limited to such applications. In one embodiment, the invention comprises a fuse which can be programmed to represent more than two states (e.g., a tristate fuse).

With the invention, a magnetically alignable material is formed over an orthogonal pair of wires. The magnetic state (reluctance) of the magnetic material is sensed by current flow in this wire pair. At least three states are possible, north aligned, south aligned, and non-magnetic/non-aligned. As would be known by one ordinarily skilled in the art given this disclosure, additional states such as east, west, north-east, north-west, etc. could be produced by the invention. Therefore, while the following examples discuss a programmable device having three states, the number of states is only limited by the wiring configurations and other similar design constraints.

Figure 2:
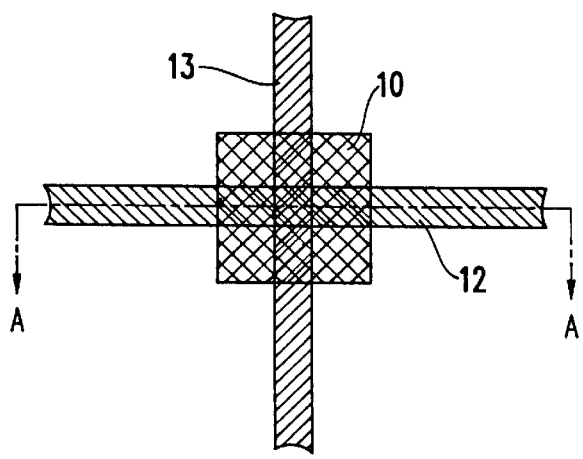
FIG. 2 is a schematic diagram of a top view of the inventive fuse.

Referring now to the drawings, a first embodiment of the invention is shown in FIG. 1. All sectional drawings (FIGS. 1, 3 and 5–8) are shown through line AA of FIG. 2. In FIGS. 1 and 2, magnetic material 10 is formed in a substrate 15 at, for example, the same level as a chip contact pad 11.

A first wire 12 runs below the magnetic material 10, and a second wire 13, orthogonal to the first 12 runs below the first wire 12. In this particular embodiment, a passivation layer 14 is opened over the contact pad 11. The magnetic material 10 and both wires 12 and 13 are electrically isolated from one another.

The first and second wires 12, 13 are arranged in this pattern to sense the north or south alignment of the magnetic material 10. However, as would be known to one ordinarily skilled in the art given this disclosure, additional wires may be used to sense additional magnetic alignments, such as those discussed above (e.g., east, west, etc.). Further, while FIG. 2 illustrates the magnetic material 10 as a square and the sense wires 12 and 13 as lines, either or both could be rectangular or have been spirals laid out in squares, rectangles, etc. Thus, the invention is not limited to the shapes shown in the examples discussed herein, but includes all possible shapes to achieve the magnetic programming for a given specific situation, as would be known by one ordinarily skilled in the art given this disclosure.

In the embodiment shown in FIG. 1, the magnetic material is formed in a damascene process where an opening or "trench" is filled with the magnetic material and planarized. For example, this embodiment (described in a damascene structure) may be fabricated by the following sequence. Starting with a wafer 15 having all chip layers lower than last metal (pad) 11 fabricated, a trench is formed and the magnetic material 10 is deposited. Then, the magnetic material 10 is chemically mechanically polished (CMP) to form a planar surface. Next, a thin protective layer, such as an oxide (not shown), is deposited to prevent aluminum or copper contamination of the magnetic material 10. The last metalization layer 11 can then be formed using similar damascene processing that includes forming a trench, depositing metal and chemical mechanical polishing. Finally, the final passivation layer 14 is formed and patterned to have openings over the pads.

The last metalization layer 11 may be formed before or after the magnetic material 10. Also, if the last metalization wiring layer 11 would not contaminate the magnetic material 10 or change its properties, then the thin oxide layer could be eliminated.

Figure 3:
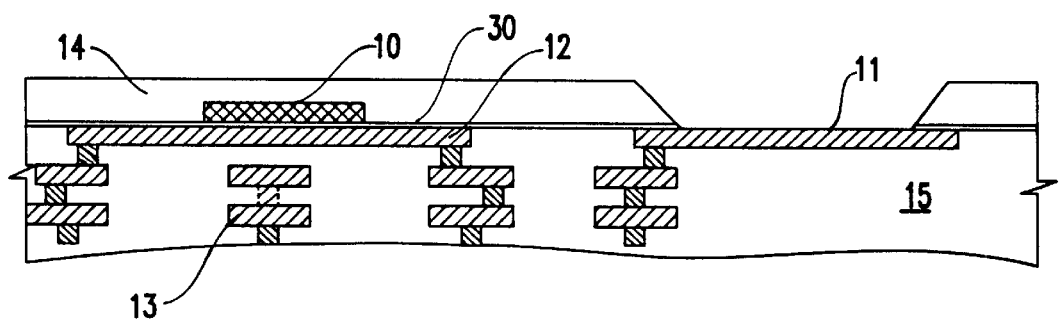
FIG. 3 is a schematic diagram of a cross-section of a second embodiment of the inventive fuse.

FIG. 3 is a cross-sectional view of a second embodiment of the invention, where the magnetic material 10 is formed at a layer above the last metalization layer. The embodiment shown in FIG. 3 is also different from the embodiment shown in FIG. 1 in that the magnetic material is not formed in a damascene process, but instead is formed in a lithographic patterning process.

For example, the embodiment shown in FIG. 3 (e.g., a non-damascene structure) may be fabricated by the following sequence. Starting with a wafer 15 having all chip layers up to and including last metal (pad) 11 fabricated, a thin protective layer 30 (e.g., an oxide) is deposited to prevent aluminum or copper contamination of the magnetic material 11. Then, a resist is applied and patterned and a seed layer of the magnetic material 10 is deposited. Next, the magnetic material 10 is electroplated and the resist and unwanted magnetic material and seed layer are lifted using well-known conventional processes. Finally, the final passivation layer 14 is formed and opened over the pads 11.

FIGS. 1 and 3 illustrate two possible structures in which the invention may be embodied. However, the invention is not limited to these structures and, as would be known by one ordinarily skilled in the art given this disclosure, the invention is equally applicable to any similar structure in which a programmable device is needed.

Turning to programming of the inventive device, the magnetic domains of all the devices are aligned in the same direction by placing the devices (e.g., a wafer of the devices) into a strong uniform magnetic field. The devices are heated to their Curie temperature to allow the molecules to align with the strong magnetic field during cooling. This initial programming places all of the devices in a predetermined direction which, for this example, will be referred to as north. Tests could be performed at this point to verify the initial programming.

The manufacturing process must be controlled such that the temperature does not affect the chip/module/package materials and the proper support circuits are in place. Materials must be selected to be compatible with the interlevel wiring insulator and chip packaging temperatures that will be encountered subsequent to programming. The Curie temperature must not be below the temperatures used in packaging which can range from 300° C. to 415° C. or the device may be unintentionally reprogramed.

If standard oxide interlevel dielectrics are used in the structure where the devices will be located, the upper Curie temperature limit would be that reachable by laser heating (e.g., 400–800° C.). If low-k dieletrics are used, their glass transition temperature must not be exceeded or they will densify. For organic insulating foams, Tg is about 400° C., and for glasses, Tg is about 600–700° C. and, again, the Curie temperature of the magnetic material must be selected to be below these temperatures.

A most suitable class of magnetic materials are NiFe alloys on the range of 79% Ni-21% Fe to 82% Ni-18% Fe. A 19% Fe, 81% Ni alloy having a Tc of 561° C. would work well for all conditions listed above. Other alloys include 1040 Alloy (3% Mo, 11% Fe, 14% Cu, 72% Ni) Tc 290° C., Isoperm (55% Fe, 36% Ni, 9% Cu) Tc 300° C. at the low end, peralloy (45% Ni. 55% Fe) Tc 437° C. The Low Ni to Fe ratio compounds (approximately 20% Ni, 80% Fe) are easily electroplated.

Selected devices are then reprogrammed by reversing or nullifying their magnetic fields as follows. To program individual devices prior to laser treatment as described below the wafer is placed is a uniform magnetic field weaker and of opposite direction (e.g., south) than that used initially, such that none of the magnetic states will spontaneously change direction. For example, the initial programming field could have a magnetic strength of 1000 A/m (of order of the saturation field), while the reprogramming magnetic field could have a lesser strength of 100 A/m (but not exceeding the material coercivity).

A selective heating device, such as a spot beam laser could then be used to heat only the selected f uses to their Curie temperature. Alternatively, the passivation layer 14 may be selectively pattern to expose only the devices which are to be reprogrammed. Then a wide-angle laser or other similar energy transfer system can be exposed indiscriminately across the entire wafer. This process would selectively heat only the exposed devices. After the programming, the passivation layer 14 could be reformed to cover the reprogrammed devices. As they cool down, only the devices which were heated will pick up the direction of the programming magnetic field.

Additional programming can be performed by placing the wafer in the weaker magnetic field (described above) that has a different orientation and selectively heating the devices. As each of the reprogramming processes proceeds, the heated devices will take down the directional magnetic characteristic of the magnetic field to which they were last exposed. For example, if a tristate device were desired, a third level of programming could be performed to provide a neutral magnetic field, as described below.

To form such a tristate device the wafer could be placed in a magnetic field that is weaker than the previous two, and which is set to neutralize the earth's magnetic field (approximately 60 A/m ). Any device that heated above its Curie temperature will have its domains aligned randomly upon cool down because of the essentially neutral magnetic field.

Figure 5:
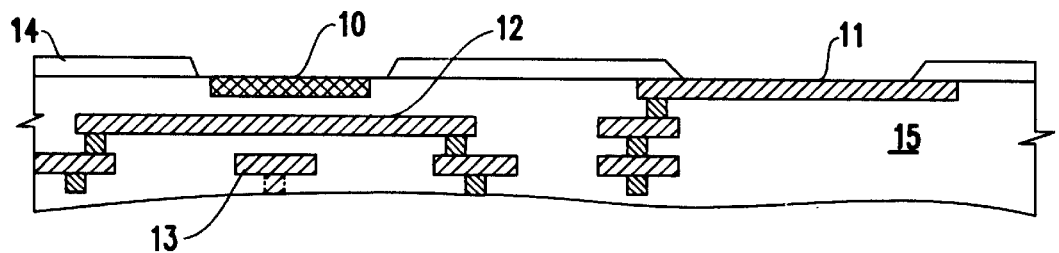
FIG. 5 is a schematic diagram of a cross-section of the inventive fuse which illustrates the programming of the fuse.
Figure 6:
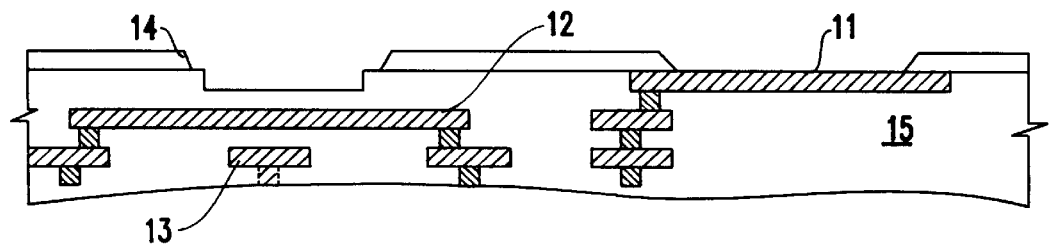
FIG. 6 is a schematic diagram of a cross-section of the inventive fuse which illustrates the programming of the fuse.

Alternatively, the devices can be "neutralized' by being physically removed. More specifically as shown in FIGS. 5–8, the embodiments shown in FIGS. 1 and 3 can be neutralized as follows. FIG. 5 is the damascene structure shown in FIG. 1. In FIG. 5 portions of the passivation layer 14 are removed above devices which are to have the magnetic material removed. A conventional process such as masking and etching or laser oblation can be performed to selectively exposed the magnetic material 10 of selected devices on a given chip or wafer. The magnetic material which is exposed can then be removed using any conventional process such as etching or laser melting.

Figure 7:
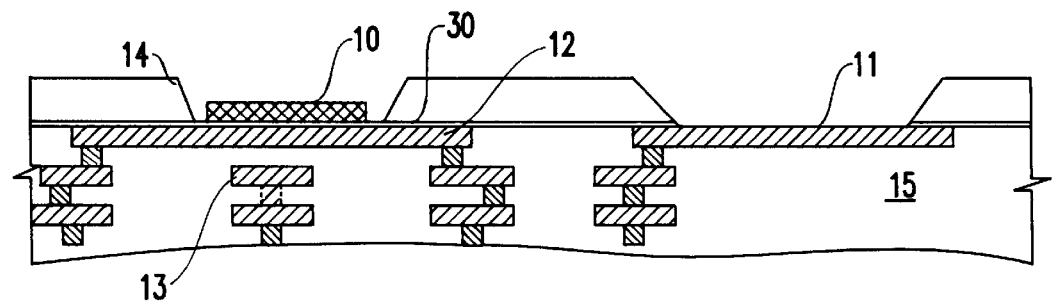
FIG. 7 is a schematic diagram of a cross-section of the inventive fuse which illustrates the programming of the fuse.
Figure 8:
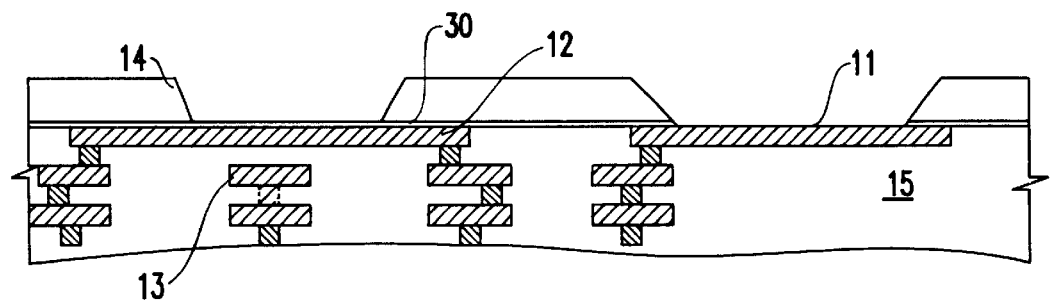
FIG. 8 is a schematic diagram of a cross-section of the inventive fuse which illustrates the programming of the fuse.

In a similar way in FIG. 7, the second embodiment of the invention which is shown above in FIG. 3, is also neutralized by removing the magnetic material 10. More specifically, the passivation layer 14 is selectively removed to expose magnetic material 10 of the devices which are to be neutralized and, as shown in FIG. 8, the magnetic materials 10 is removed, as discussed above.

Figure 9:
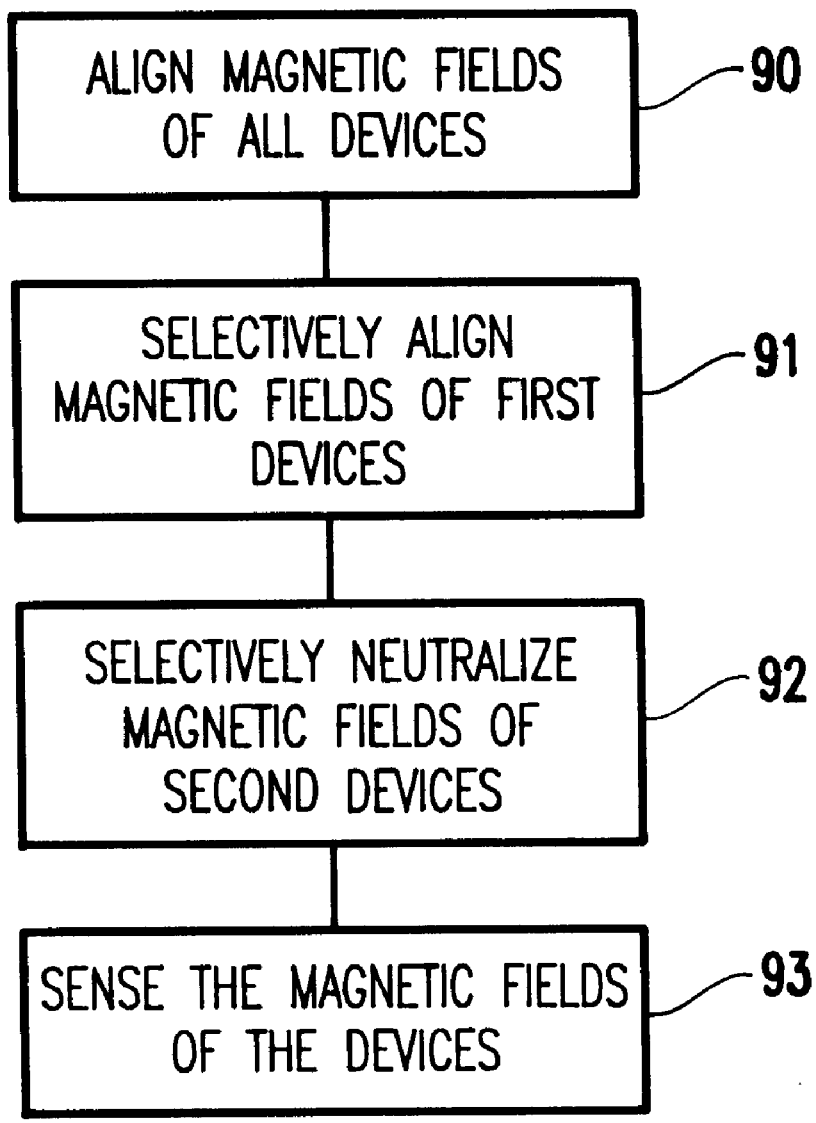
FIG. 9 is a flow diagram of an embodiment of the invention.

FIG. 9 is a flow diagram describing an embodiment of the invention. Magnetic fields of all devices are aligned as shown in item 90. Magnetic fields of first devices are selectively aligned as shown in item 91. In item 92 magnetic fields of second devices are selectively neutralized and in item 93 the magnetic fields of the devices are sensed.

The magnetic state of the different devices can be sensed by using any of a wide variety of circuits as would be known by one ordinarily skill in the art given this disclosure. For example, the circuit illustrated in FIG. 4 could sense the difference magnetic fields (e.g., north, south and neutral) of the differently programed devices discussed above. More specifically, FIG. 4 illustrates the devices 40–43, amplifiers 44, multipliers 45, filters 46 and comparators 47–48 and an AC generator 49.

Figure 4:
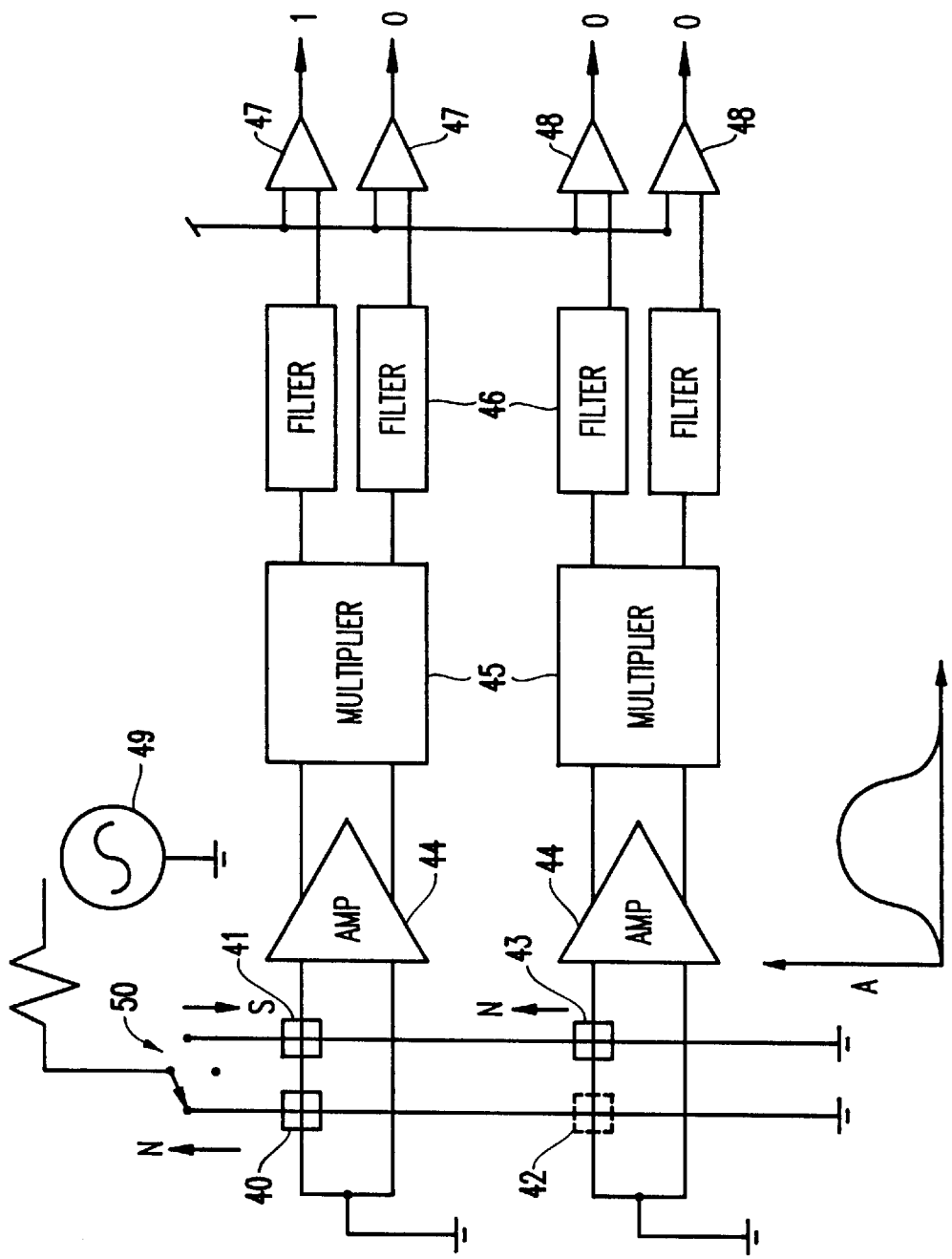
FIG. 4 is a schematic diagram of a circuit for sensing changes in the inventive fuse.

As shown in FIG. 4, the invention detects the presence or absence of a magnetic fuse and if the fuse is present. The invention also detects the fuses polarization (magnetization North or South). When an AC signal is applied to fuse site 42 which is either missing fuse material or which has not been magnetized, no AC signal is coupled into amplifiers 44. When an AC signal is applied to either site 40 or 41, a signal which is either in-phase or out-of-phase with signal 49 is coupled to amplifiers 44. The multiplexers 45 generate a DC component which reflects the phase of the input signal. Filters 46 remove the AC signal. Comparators 47 and 48 indicate if any signal is present and its phase.

The magnetic material fuse is preferably shaped as a rectangle with the poles at the long ends. Therefore, in a preferred embodiment, all the devices on a chip could be rectangular and aligned in the same direction.

With the invention, a circuit may be programmed by altering its magnetic field. Further, the invention alters the programmable device using a process which substantially reduces or eliminates the possibility of affecting adjacent structures. This structure and process is superior to conventional fuses because low level energy magnetic and laser sources are utilized to program the device. The energy level utilized by the invention does not cause the fuse material to explode or boil as conventional fusing processes do. Therefore, programming (or blowing) of the inventive device does not damage the surrounding dielectric material. Further, since the magnetic material does not explode and possibly extend above the dielectric, it will not corrode or detract from the reliability of the remaining circuit.

Thus, the invention expands the usefulness of programmable and fusible devices and increases the manufacturing yield of circuits which include such devices.

Additionally, with the invention, there are three states per "fuse" and infinitely many if "fuses" are ganged logically, the fuse is resettable either locally (individually) or globally for entire chips or wafers, it is compatible with many low-k dielectrics currently being investigated, and the locked states security feature is achievable by removing magnetic material after programming is engaged.

Also, the invention is compatible with both Al and Cu interconnect technologies, uses standard back-end-of-the-line (BEOL) processing (except for introduction of magnetic material), standard testing infrastructure, and standard fusing (programming) infrastructure (but with magnetic field added). The invention affords hardware salvage value with reset options from field returns or upgrades and affords effective IPL protection since the structure is easily discoverable.

While the invention has been described in terms of preferred embodiments, those skilled in the art will recognize that the invention can be practiced with modification within the spirit and scope of the appended claims.

What is claimed is:

1. A programmable circuit, comprising:

a magnetic device having a reluctance which is alterable; and wherein said reluctance comprises a magnetic material with its domains aligned in a first direction.

2. A fuse, comprising:

a magnetic device having a reluctance which is alterable; and wherein said reluctance comprises a magnetic field aligned in a first direction.

3. The programmable circuit in claim 1, wherein first devices of said magnetic devices have a first magnetic field aligned in a first direction and second devices of said magnetic devices have a second magnetic field aligned in a second direction, different than said first direction.

4. The programmable circuit in claim 3, wherein third devices of said magnetic devices have no magnetic field.

5. The programmable circuit in claim 4, wherein said magnetic devices comprise tristate fuses.

6. The fuse in claim 2, wherein first devices of said magnetic devices have a first magnetic field aligned in a first direction and second devices of said magnetic devices have a second magnetic field aligned in a second direction, different than said first direction.

7. The fuse in claim 6, wherein third devices of said magnetic devices have no magnetic field.

8. The fuse in claim 7, wherein said magnetic devices comprise tristate fuses.

* * * * *